United States Patent
Chang et al.

(10) Patent No.: US 9,746,599 B2
(45) Date of Patent: Aug. 29, 2017

(54) DISPLAY DEVICE AND METHOD OF FABRICATING THE SAME

(71) Applicant: Samsung Display Co., Ltd., Yongin, Gyeonggi-do (KR)

(72) Inventors: Se In Chang, Yongin (KR); Kyoung Woo Park, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 205 days.

(21) Appl. No.: 14/267,120

(22) Filed: May 1, 2014

(65) Prior Publication Data

US 2015/0198759 A1    Jul. 16, 2015

(30) Foreign Application Priority Data

Jan. 13, 2014    (KR) .................. 10-2014-0004015

(51) Int. Cl.
*G02F 1/1345* (2006.01)
*F21V 8/00* (2006.01)
*H05K 1/02* (2006.01)
*B29L 31/34* (2006.01)
*F16B 11/00* (2006.01)
*H05K 1/18* (2006.01)

(52) U.S. Cl.
CPC ......... *G02B 6/0036* (2013.01); *H05K 1/0274* (2013.01); *B29L 2031/3475* (2013.01); *F16B 11/006* (2013.01); *H05K 1/189* (2013.01); *H05K 2201/0112* (2013.01); *H05K 2201/10128* (2013.01)

(58) Field of Classification Search
CPC ........ G02B 6/0036; G06F 1/16; H05K 1/028; H05K 2201/10128; H05K 1/0274; H05K 1/189; H05K 2201/0112; B29C 65/4845; B29C 65/54; B29L 2031/3475; F16B 11/006
USPC ......................................................... 349/149
See application file for complete search history.

(56) References Cited

U.S. PATENT DOCUMENTS

2010/0097552 A1* 4/2010 Shinya .................. C09J 109/00
                                                         349/122
2011/0122000 A1* 5/2011 Liu ....................... G06F 3/0202
                                                         341/20
(Continued)

FOREIGN PATENT DOCUMENTS

KR      10-0727613       6/2007
KR      10-2011-0111749  10/2011
KR      10-2012-0075165  7/2012

*Primary Examiner* — Charles Chang
(74) *Attorney, Agent, or Firm* — Knobbe Martens Olson & Bear LLP

(57) ABSTRACT

A display device includes: a display panel including a display region and a peripheral region; a transparent protector disposed to cover the display panel; a bezel print pattern disposed between the display panel and the transparent protector and configured to form a light shield region corresponding to the peripheral region; at least one light guide film disposed between the display panel and the bezel ink pattern in the light shield region; an ultraviolet (UV)-proof printed circuit board (PCB) disposed between the display panel and the light guide film and in contact with the light guide film; and a UV curing layer formed between the display panel and the transparent protector.

18 Claims, 12 Drawing Sheets

(56) References Cited

U.S. PATENT DOCUMENTS

| | | | |
|---|---|---|---|
| 2012/0139821 A1* | 6/2012 | Kim | H01L 51/5253 345/76 |
| 2012/0235048 A1* | 9/2012 | Kim | G02F 1/133308 250/372 |
| 2013/0182200 A1 | 7/2013 | Ishizumi | |
| 2013/0302539 A1* | 11/2013 | Fujii | C08F 220/10 428/1.54 |

* cited by examiner

DISPLAY DEVICE AND METHOD OF FABRICATING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

CROSS-REFERENCE TO RELATED APPLICATIONS

This application claims priority from Korean Patent Application No. 10-2014-0004015 filed on Jan. 13, 2014 in the Korean Intellectual Property Office, the disclosure of which is incorporated herein by reference in its entirety.

BACKGROUND

Field

Embodiments relate to a display device and a method of fabricating the same.

Description of the Related Technology

Many existing display devices have been replaced with thin, flat panel display devices such as liquid crystal displays (LCDs) or organic light-emitting diode (OLED) displays.

A flat panel display device may generally include a transparent protector, which is provided on a display panel where images are realized and protects the display panel. To improve the visibility of images displayed by the display panel and the robustness of the display panel, the display panel and the transparent protector may be firmly bonded together by using an ultraviolet (UV)-curable adhesive. More specifically, the display panel and the transparent protector may be firmly attached to each other with a UV-curable adhesive interposed therebetween, and the UV-curable adhesive may be cured by applying UV light to the top of the transparent protector and the sides of the flat panel display device.

SUMMARY OF CERTAIN INVENTIVE ASPECTS

Embodiments provide a display device, in which a light guide film with a light guide function may be disposed between a transparent protector and part of a display panel overlapped by a light shield region of the transparent protector, thereby minimizing the area of an uncured ultraviolet (UV)-curable adhesive in the space between the transparent protector and the part of the display panel overlapped by the light shield region.

Embodiments also provide a method of fabricating a display device, which is capable of minimizing the area of an uncured UV-curable adhesive in the space between a transparent protector and part of a display panel overlapped by a light shield region of the transparent protector by adjusting the intensity and/or amount of UV light to be applied for curing a UV-curable adhesive such that more intense UV light may be incident upon a light guide film with a light guide function than other parts of the display device.

However, embodiments are not restricted to the one set forth herein. The above and other embodiments will become more apparent to one of ordinary skill in the art to which the present invention concept pertains by referencing the detailed description of the embodiments given below.

According to embodiments, provided is a display device, comprising: a display panel including a display region and a peripheral region; a transparent protector disposed to cover the display panel; a bezel print pattern disposed between the display panel and the transparent protector and configured to form a light shield region corresponding to the peripheral region; at least one light guide film disposed between the display panel and the bezel ink pattern in the light shield region; an ultraviolet (UV)-proof printed circuit board (PCB) disposed between the display panel and the light guide film and in contact with the light guide film; and a UV curing layer formed between the display panel and the transparent protector.

The light guide film may include a stack of a light guide layer and an adhesive layer formed below the light guide layer and coupled to the transparent protector.

The light guide layer may comprise a plurality of embossed patterns.

The embossed patterns may be formed on a flat top surface and/or a flat bottom surface of the light guide layer.

The embossed patterns may be formed on at least one of a part of the flat top surface or a part of the flat bottom surface of the light guide layer on one side of a point or surface of contact between the UV-proof PCB and the light guide film.

The embossed patterns may be formed to have a uniform pitch therebetween.

The embossed patterns may be formed to have different pitches therebetween.

A pitch between a pair of adjacent embossed patterns in an area near a light incidence plane of the light guide layer may be greater than a pitch between a pair of adjacent embossed patterns in an area near a light exit plane of the light guide layer.

A pitch between a pair of adjacent embossed patterns may gradually decrease from a light incidence plane of the light guide layer to a light exit plane of the light guide layer.

The adhesive layer may include a layer of an adhesive.

The adhesive layer include an adhesive double-sided tape.

The display device may comprise two or more light guide films configured to be spaced from each other.

The UV-proof PCB may include a flexible PCB.

The UV-proof PCB may be configured to be connected to a driving circuit of the display panel.

The display device may further comprise a touch screen panel disposed between the display region of the display panel and the transparent protector.

The UV-proof PCB may be configured to be connected to the touch screen panel.

The display device may further comprise a polarizing plate disposed between the touch screen panel and the transparent protector.

An embodiment of a method of fabricating a display device comprises: applying a UV curing agent between a transparent protector, on which a bezel print pattern and a light guide film are formed, and a display panel, to which a UV-proof PCB is connected, the light guide film being attached on the bezel print pattern; and curing the UV curing agent by applying UV light while adjusting the amount or intensity of the UV light such that UV light incident upon the light guide film is more intense than UV light incident upon other parts of the display device.

Another embodiment of a method of fabricating a display device comprises: preparing a transparent protector, on which a bezel print pattern and a light guide film are formed, a touch screen panel, to which a UV-proof PCB is connected, and a display panel, the light guide film being attached on the bezel print pattern; disposing the touch screen panel between the transparent protector and the display panel; applying a UV curing agent between the transparent protector and the display panel; and curing the UV curing agent by applying UV light while adjusting at least one of the amount or the intensity of the UV light such that UV light incident upon the light guide film is more intense than UV light incident upon other parts of the display device.

The method may further comprise disposing a polarizing plate between the touch screen panel and the transparent protector.

BRIEF DESCRIPTION OF THE DRAWINGS

The above and other aspects and features of the present invention will become more apparent by describing in detail certain embodiments thereof with reference to the attached drawings, in which.

DETAILED DESCRIPTION OF THE EMBODIMENTS

Figure 1:
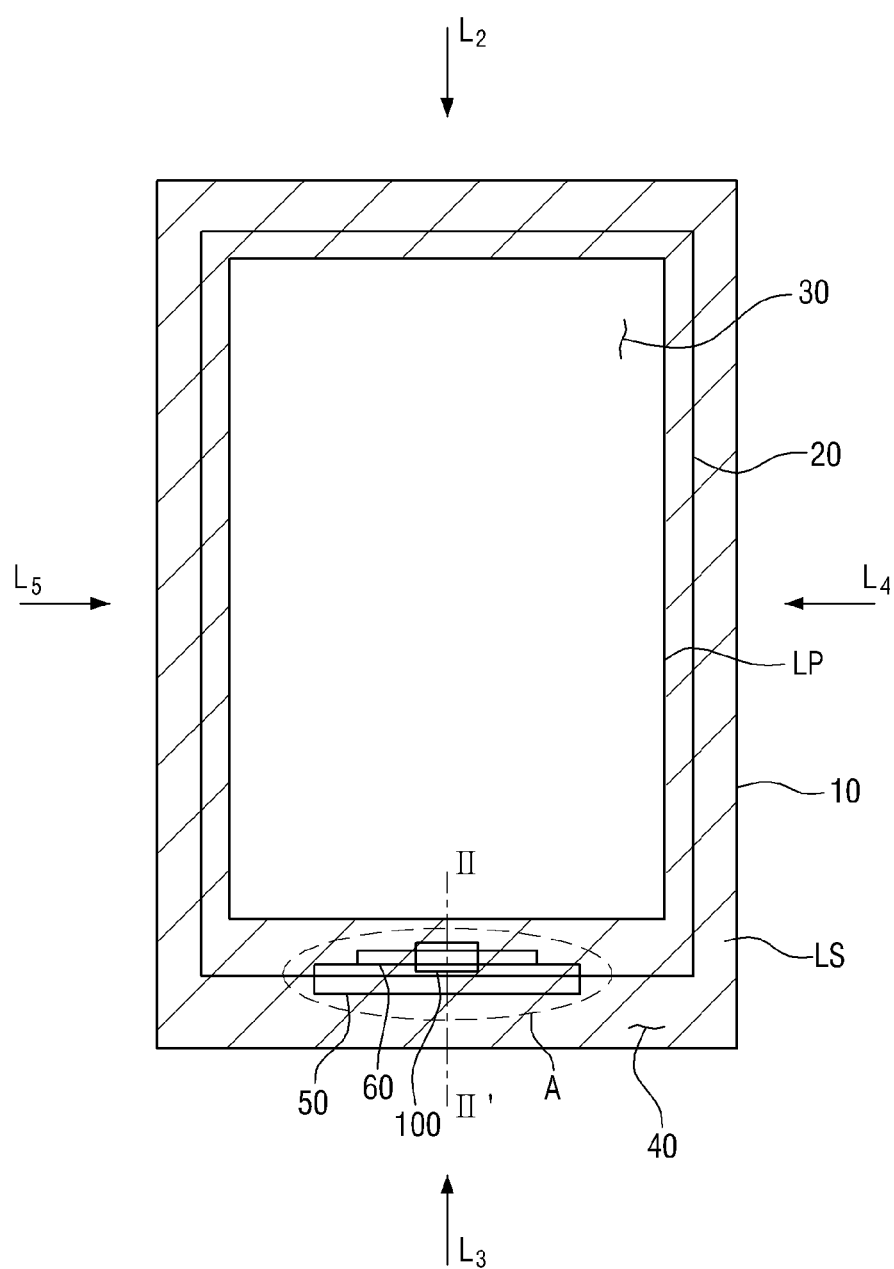
FIG. 1 is a layout diagram illustrating a display device according to an embodiment.

Advantages and features of the present invention and methods of accomplishing the same may be understood more readily by reference to the following detailed description of certain embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

In the drawings, the thickness of layers and regions may be exaggerated for clarity. As used herein, the term "and/or" includes any and all combinations of one or more of the associated listed items.

Hereinafter, certain embodiments of the present invention will be described with reference to the accompanying drawings.

Figure 2:
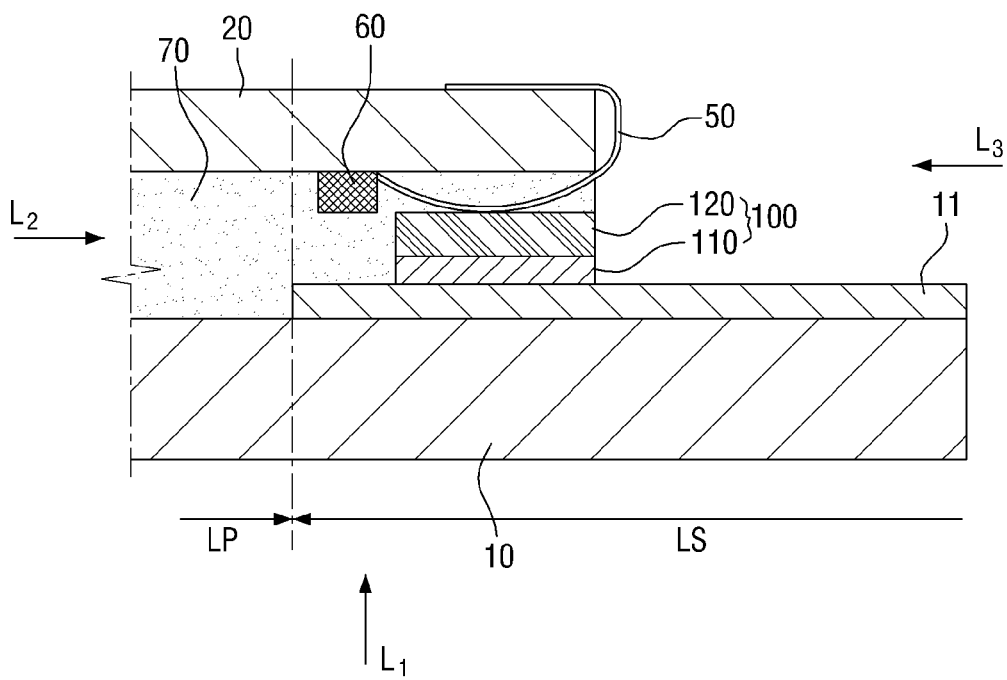
FIG. 2 is a cross-sectional view taken along line II-IF of FIG. 1.

FIG. 1 is a layout diagram illustrating a display device according to an embodiment, and FIG. 2 is a cross-sectional view taken along line II-II' of FIG. 1. Referring to FIGS. 1 and 2, a display device according to an embodiment may include a transparent protector 10, a bezel print pattern 11, a display panel 20, a printed circuit board (PCB) 50, a driving circuit 60, an ultraviolet (UV) curing layer 70 and a light guide film 100.

The display panel 20 may include a display region 30 and a peripheral region 40. The display region 30 may be a region in which images are displayed, and the peripheral region 40 includes parts of the display panel 20 that are outside the display region 30. In a non-limiting example, the peripheral region 40 may surround the display region 30. The display panel 20 may be, for example, a liquid crystal display (LCD) panel or an organic light-emitting diode (OLED) display panel. The LCD panel or the OLED display panel may be, for example, an active display panel including low-temperature polycrystalline silicon (LTPS) thin-film transistors (TFTs).

The driving circuit 60 may be formed in the peripheral region 40. The driving circuit 60 may transmit electric signals to the display region 30. The driving circuit 60 may be provided in the form of an integrated circuit (IC), and may be mounted in the peripheral region 40 of the display panel 20. The driving circuit 60 may be electrically connected to the PCB 50.

The PCB 50 may be a flexible PCB including a flexible material. The PCB 50 may be connected to the display panel 20. More specifically, the PCB 50 may be directly connected to the driving circuit 60, or may be connected to the display panel 20 via connecting wires formed in the peripheral region 40 of the display panel 20. The PCB 50 may include a lightproof material capable of blocking UV light. The PCB 50 may block UV light $L_3$ incident thereupon. One end of the PCB 50 may be connected to a first surface of the display panel 20, and the other end of the PCB 50 may be connected to a second surface of the display panel 20. In a non-limiting example, the PCB 50 may extend from the driving circuit 60 of the display panel 20 to the second surface of the display panel 20. The PCB 50 may be disposed between the display panel 20 and the light guide film 100. The PCB 50 may be placed in contact with the light guide film 100.

The transparent protector 10 may be disposed on the display panel 20. The transparent protector 10 may protect the display panel 20 and may thus prevent the display panel 20 from being damaged or destroyed by an external shock. The transparent protector 10 may be disposed to cover the entire display panel 20. In a non-limiting example, the transparent protector 10 may have a larger area than the display panel 20. The transparent protector 10 may be disposed to not only cover the entire display panel 20, but also extend further beyond the sides of the display panel 20. The transparent protector 10 may include a light passing region LP and a light shield region LS. The light passing region LP, which corresponds to the display region 30 of the display panel 20, may be substantially overlapped by the display region 30. The light shield region LS, which corresponds to the peripheral region 40 of the display panel 20, may be substantially overlapped by the peripheral region 40. The light shield region LS may be provided along the edges of the transparent protector 10 to have a predetermined width, and may prevent the peripheral region 40 from being visible from the outside of the display device.

The bezel print pattern 11 may be formed on the transparent protector 10 along the edges of the transparent protector 10 to have a predetermined width and thickness. The bezel print pattern 11 may block UV light $L_1$ incident thereupon from the bottom of the transparent protector 10 and may thus prevent the peripheral region 40 from being visible from the outside of the display device. The bezel print pattern 11 may be formed in various colors such as, for example, black or white. The transparent protector 10 may be a window. The transparent protector 10 may be formed of a transparent material such as, for example, glass or a resin. The bezel print pattern 11 may be disposed between the transparent protector 10 and the display panel 20. More specifically, the bezel print pattern 11 may be disposed between the transparent protector 10 and the PCB 50.

The light guide film 100 may be disposed in the light shield region LS to be at least partially overlapped by the PCB 50. The light guide film 100 may be interposed, and firmly attached, between the bezel print pattern 11 and the PCB 50. The light guide film 100 may be formed on the bezel print pattern 11 and may be placed in contact with part of the PCB 50. The light guide film 100 may include an adhesive layer 110 and a light guide layer 120. The adhesive layer 110 may couple the light guide layer 120 and the bezel print pattern 11 together. The adhesive layer 110 may be a layer of an adhesive applied onto the light guide layer 120. The light guide film 100 may be a thin film, and the thin film may have a thickness of about 0.1 mm to about 1 mm. The light guide layer 120 may transmit the UV ray $L_3$, which is for curing an UV curing agent applied between the display panel 20 and the transparent protector 10.

The UV curing layer 70 may be interposed between the display panel 20 and the transparent protector 10. The UV curing layer 70 may couple the display panel 20 and the transparent protector 10 together. The UV curing layer 70 may be formed by applying a UV curing agent between the display panel 20 and the transparent protector 10 and applying UV light so as to cure the UV curing agent. The UV curing layer 70 may be formed to have a stepwise shape in consideration of the driving circuit 60 formed on the display panel 20, and the bezel print pattern 11 and the light guide film 100 formed on the transparent protector 10.

Figure 3:
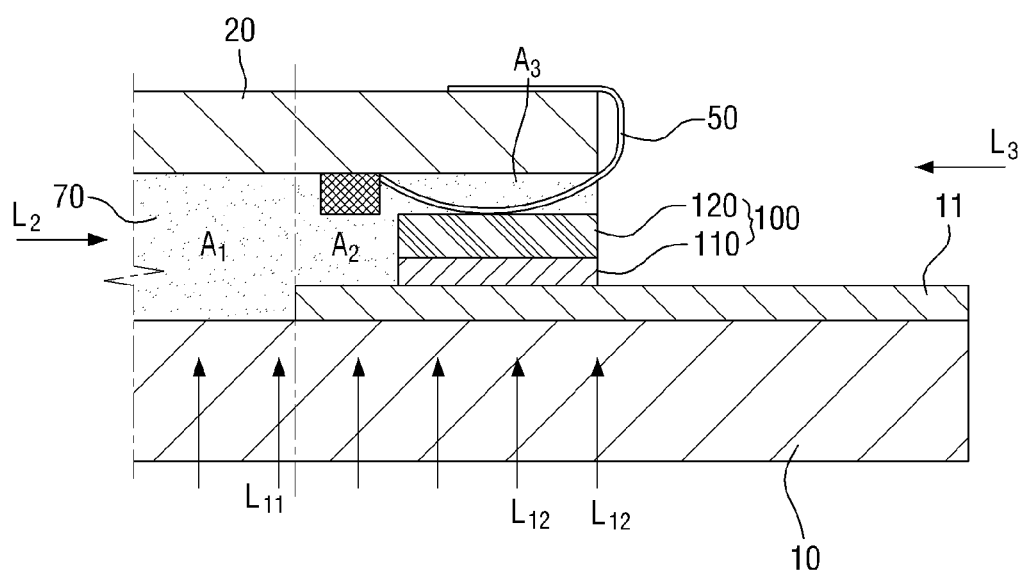
FIG. 3 is a schematic diagram illustrating an optical path in the display device of FIG. 2.
Figure 4:
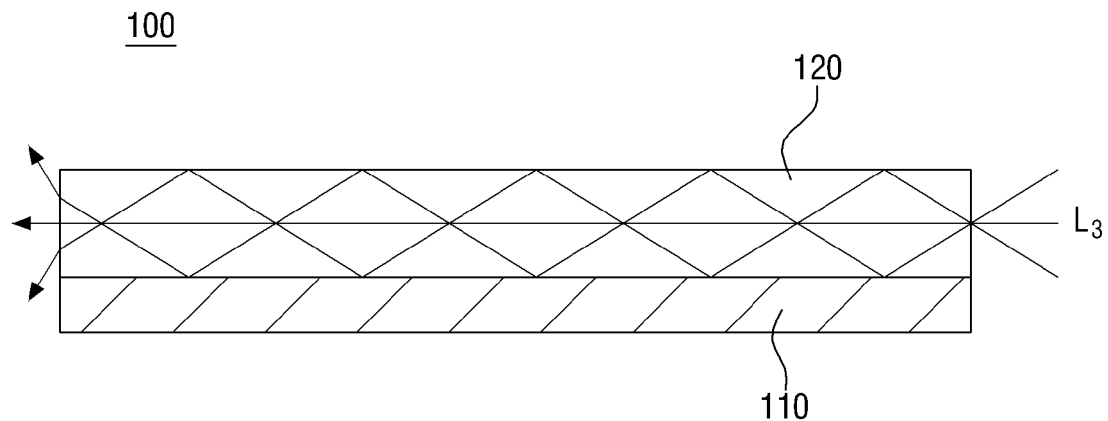
FIG. 4 is a schematic diagram illustrating an optical path in a light guide film of FIG. 3.

FIG. 3 is a schematic diagram illustrating an optical path in the display device of FIG. 2, FIG. 4 is a schematic diagram illustrating an optical path in the light guide film 100, and FIG. 4 is a schematic diagram illustrating an optical path in the light guide film 100.

Referring to FIGS. 1 to 4, the UV curing layer 70 may be formed between the transparent protector 10 and the display panel 20 by applying a UV curing agent between the transparent protector 10 and the display panel 20 and applying UV light ($L_1$, $L_2$, $L_3$, $L_4$ and $L_5$) to the UV curing agent.

The UV light $L_2$, the UV light $L_3$, the UV light $L_4$ and the UV light $L_5$ may be incident upon the sides of the display device, as illustrated in FIG. 1, and the UV light $L_1$ may be incident upon the top or the bottom of the display device, as illustrated in FIG. 2. The UV light $L_1$ may be incident upon the display panel 20 from the outside of the transparent protector 10, passing through the light passing region LP.

Referring to FIG. 3, the UV curing layer 70 may include first, second and third curing regions $A_1$, $A_2$ and $A_3$. The first curing region $A_1$ may be a region completely cured by UV light $L_{11}$, which is incident upon the top or the bottom of the display device, and the UV light $L_2$, which is incident upon the light guide film 100 from the opposite direction to that of the UV light $L_3$. The second curing region $A_2$ may be a region completely cured by the UV light $L_3$, which is emitted through a second end of the light guide film 100. The third curing region $A_3$ may be a region incompletely cured, or not cured at all, because of UV light $L_{12}$ and the UV light $L_3$ being blocked by the bezel print pattern 11 and the PCB 50. An uncured UV curing agent may be in a liquid phase.

Referring to FIG. 4, at least part of the UV light $L_3$, which is incident upon the light guide layer 120, may be transmitted from a first end to a second end of the light guide layer 120 through total reflection within the light guide layer 120, and the rest of the UV light $L_3$ may travel straight through the light guide layer 120 without going through any total reflection. UV light that arrives at the second end of the light guide layer 120 may be emitted through the second end of the light guide layer 120, and may thus travel toward the second curing region $A_2$. Even though the second curing region $A_2$ is included in the light shield region LS and is covered by the PCB 50, the second curing region $A_2$ may be reached by the UV light $L_3$ through the light guide layer 120. Accordingly, the UV curing agent of the UV curing layer 70 may be completely cured during the fabrication of the display device.

The first end of the light guide layer 120 may be interpreted as a light incidence plane, and the second end of the light guide layer 120 may be interpreted as a light exit plane. The second end of the light guide layer 120 may also be interpreted as being a part close to the second curing region $A_2$, and the first end of the light guide layer 120 may also be interpreted as being a part distant from the second curing region $A_2$. The light guide film 100 may have a smooth surface, obtained by mirror finishing, at the first end thereof.

Figure 5:
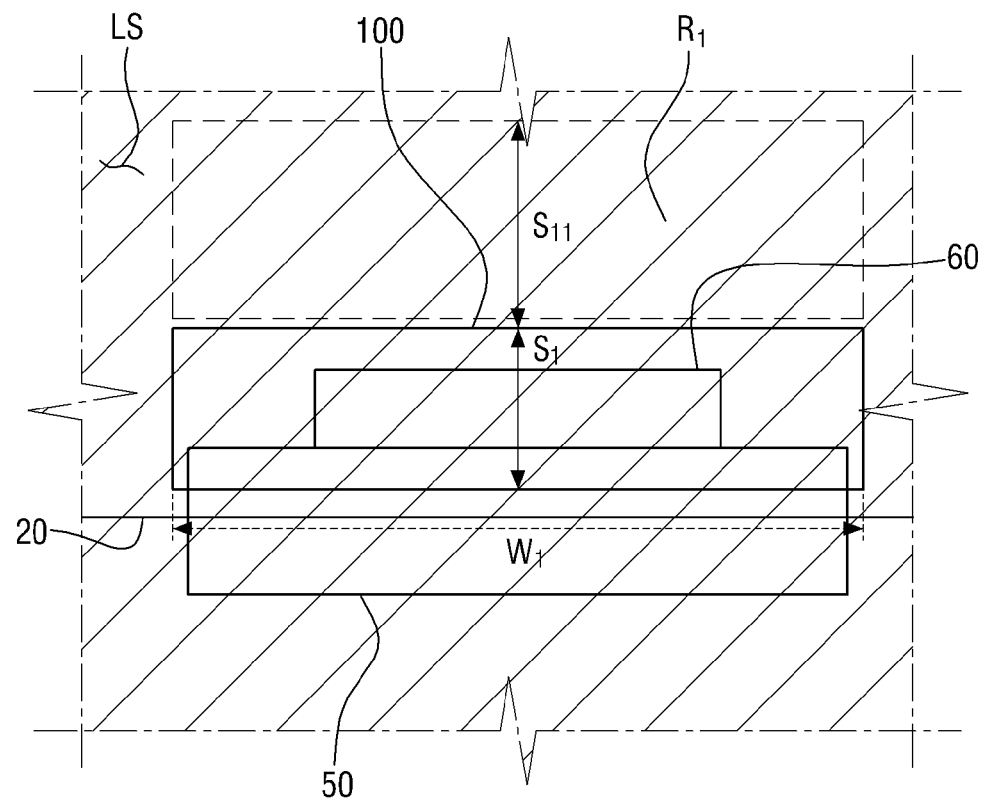
FIG. 5 is an enlarged view illustrating portion A of FIG. 1.

FIG. 5 is an enlarged view illustrating portion A of FIG. 1. Referring to FIG. 5, the light guide film 100 may have a predetermined width $W_1$ and a predetermined length $S_1$. A first region $R_1$ may be provided over the light guide film 100. The first region $R_1$ may correspond to the second curing region $A_2$. The first region $R_1$ may have the width $W_1$ and a predetermined length $S_{11}$, and may extend from the second end of the light guide film 100 to the light shield region LS. In a non-limiting example, the width of the light guide film 100, or the width $W_1$, may be greater than the width of the PCB 50. The width $W_1$ may be smaller than the width of the PCB 50. The length of the light guide film 100 may be equal to or less than the sum of the length $S_1$ and the length $S_{11}$.

Light guide films of display devices according to other embodiments are hereinafter described.

Figure 6:
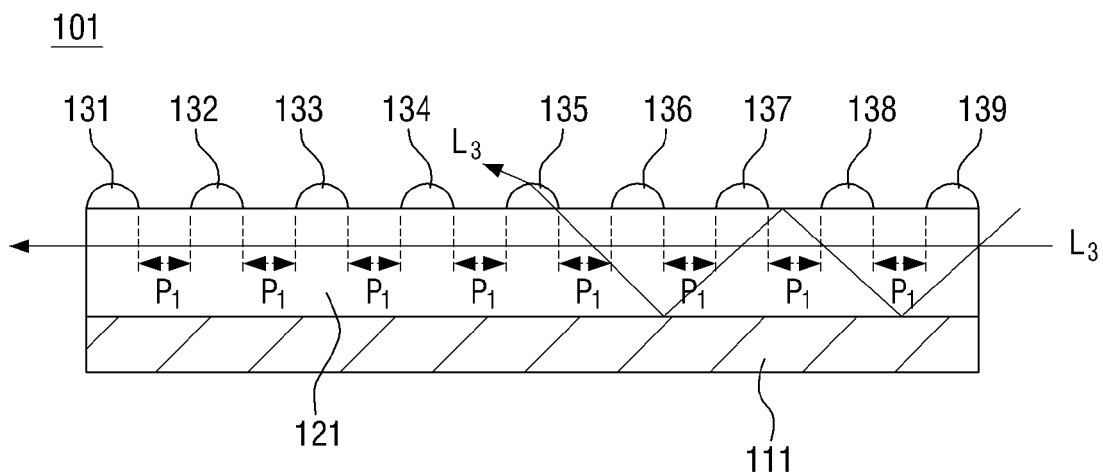
FIGS. 6 to 18 are cross-sectional views illustrating light guide films of display devices according to other embodiments.

FIG. 6 is a cross-sectional view illustrating a light guide film of a display device according to another embodiment. Referring to FIG. 6, a light guide film 101 is different from the light guide film 100 of FIG. 5 in that a plurality of embossed patterns 131 through 139 are formed on a flat top surface of a light guide layer 121.

More specifically, the embossed patterns 131 through 139 may be formed on the flat top surface of the light guide layer 121. The embossed patterns 131 through 139 may be, for example, hemispherical. The embossed patterns 131 through 139 may be evenly spaced with a pitch $P_1$ therebetween. Part of the UV light $L_3$ incident upon the light guide layer 121 may proceed from a first end to a second end of the light guide layer 121 through total reflection within the light guide layer 121, and may then be emitted through the embossed patterns 131 through 139 to be scattered in a second curing region $A_2$ above the light guide layer 121. The embossed patterns 131 through 139 may have a size of about 5 mm or less.

An adhesive layer 111 may be formed on the bottom surface of the light guide layer 121. The adhesive layer 111 may be formed, for example, by applying an adhesive on the bottom surface of the light guide layer 121 and drying the adhesive.

Figure 7:
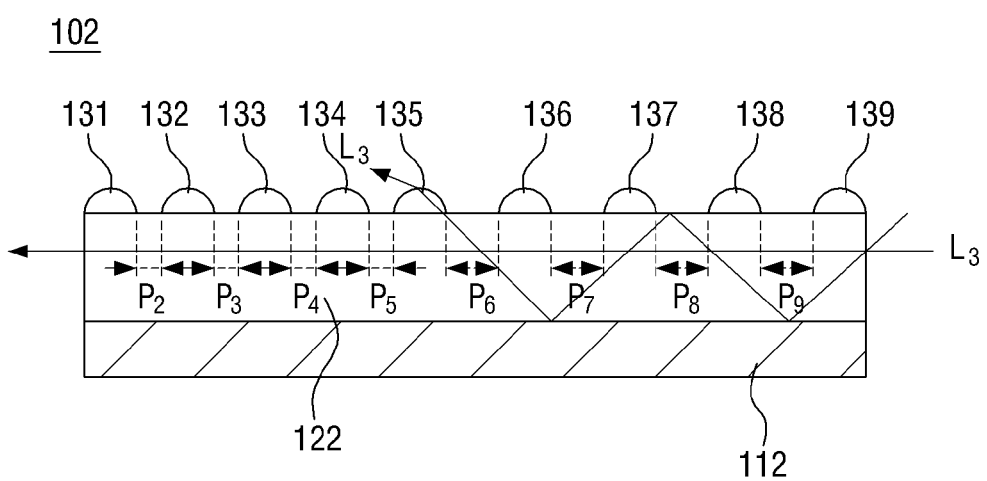

FIG. 7 is a cross-sectional view illustrating a light guide film of a display device according to another embodiment. Referring to FIG. 7, a light guide film 102 is different from the light guide film 101 of FIG. 6 in that a plurality of embossed patterns 131 through 139, which are formed on a flat top surface of a light guide layer 122, are unevenly spaced with different pitches, i.e., pitches $P_2$ through $P_9$, therebetween. An adhesive layer 112 may be formed by the same method used to form the adhesive layer 111 of FIG. 6.

The pitch between each pair of adjacent embossed patterns may be smaller in an area near a first end of the light guide film 102 than in an area near a second end of the light guide film 102. For example, the pitches between the embossed patterns 131 and 132, between the embossed patterns 132 and 133, between the embossed patterns 133 and 134, and between the embossed patterns 134 and 135, i.e., the pitches $P_2$, $P_3$, $P_4$ and $P_5$, may be smaller than the pitches between the embossed patterns 135 and 136, between the embossed patterns 136 and 137, between the embossed patterns 137 and 138, and between the embossed patterns 138 and 139, i.e., the pitches $P_6$, $P_7$, $P_8$ and $P_9$. The pitches $P_2$, $P_3$, $P_4$ and $P_5$ may all be identical or may be different from one another. For example, the pitch $P_2$ may be smaller than the pitch $P_3$, and the pitch $P_3$ may be smaller than the pitch $P_4$. Similarly, the pitches $P_6$, $P_7$, $P_8$ and $P_9$ may all be identical or may be different from one another. For example, the pitch $P_9$ may be greater than the pitch $P_8$, and the pitch $P_8$ may be greater than the pitch $P_7$. The pitch between each pair of adjacent embossed patterns may gradually decrease from the second end to the first end of the light guide film 102, from the pitch $P_9$ to the pitch $P_2$.

Figure 8:
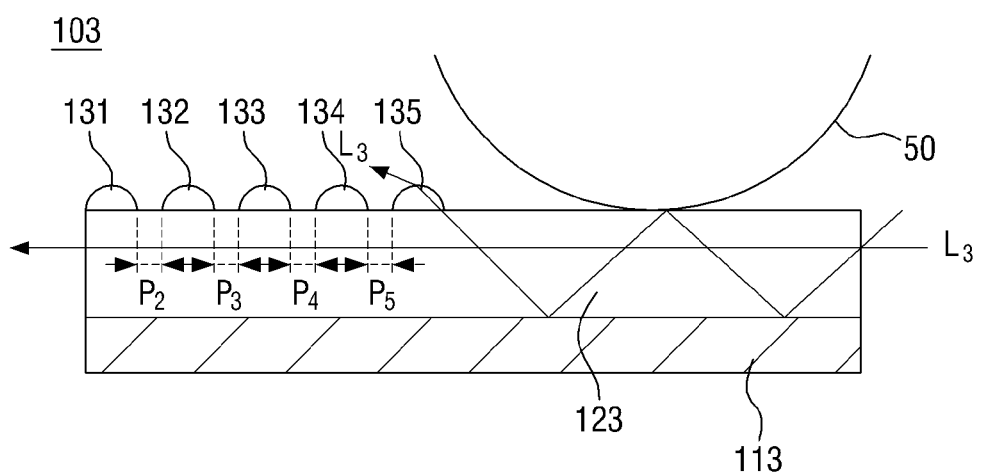

FIG. 8 is a cross-sectional view illustrating a light guide film of a display device according to another embodiment. Referring to FIG. 8, a light guide film 103 is different from the light guide film 102 of FIG. 7 in that a plurality of embossed patterns 131 through 135 are formed only on part of the top surface of a light guide layer 123. For example, the embossed patterns 131 through 135 may be formed on one side of a point or surface of contact between the PCB 50 and the light guide film 103. An adhesive layer 113 may be formed by the same method used to form the adhesive layer 111 of FIG. 6.

In a non-limiting example, the embossed patterns 131 through 135 may be evenly spaced such that pitches $P_2$, $P_3$, $P_4$ and $P_5$ thereamong may all be identical.

Figure 9:
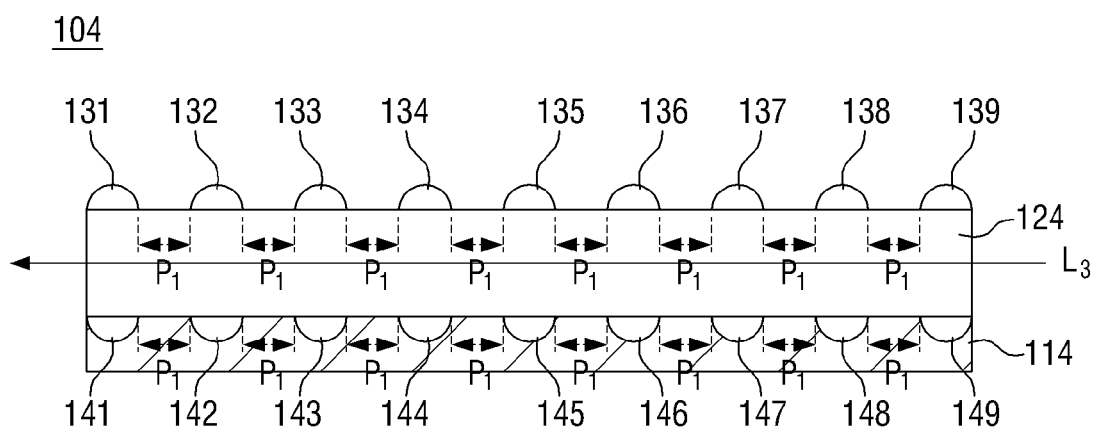

FIG. 9 is a cross-sectional view illustrating a light guide film of a display device according to another embodiment. Referring to FIG. 9, a light guide film 104 is different from the light guide film 101 of FIG. 6 in that a plurality of embossed patterns 131 through 139 and a plurality of embossed patterns 141 through 149 are formed on a flat top surface and a flat bottom surface, respectively, of a light guide layer 124. An adhesive layer 114 may be formed by the same method used to form the adhesive layer 111 of FIG. 6.

In a non-limiting example, the pitch between the embossed patterns 131 through 139 on the flat top surface of the light guide layer 124 and the pitch between the embossed patterns 141 through 149 on the flat bottom surface of the light guide layer 124 may both be the same as a pitch $P_1$. Alternatively, the pitch between the embossed patterns 131 through 139 may be different from the pitch between the embossed patterns 141 through 149.

Figure 10:
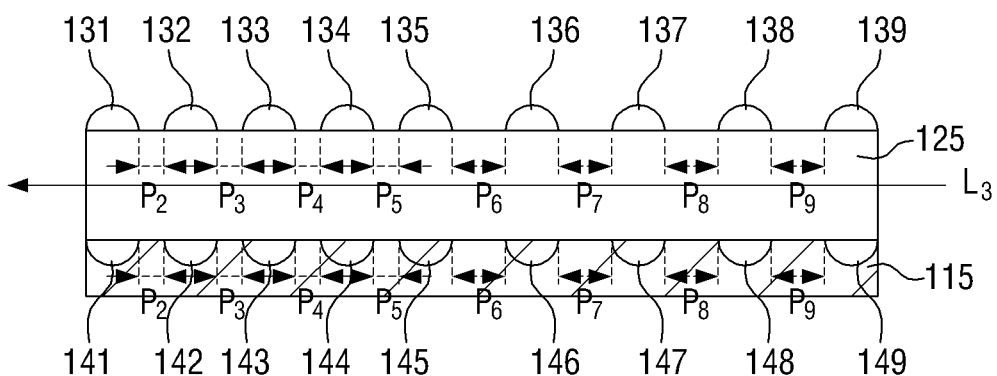

FIG. 10 is a cross-sectional view illustrating a light guide film of a display device according to another embodiment. Referring to FIG. 10, a light guide film 105 is different from the light guide film 102 of FIG. 7 in that a plurality of embossed patterns 131 through 139 and a plurality of embossed patterns 141 through 149 are formed on a flat top surface and a flat bottom surface, respectively, of a light guide layer 125. An adhesive layer 115 may be formed by the same method used to form the adhesive layer 111 of FIG. 6.

Figure 11:
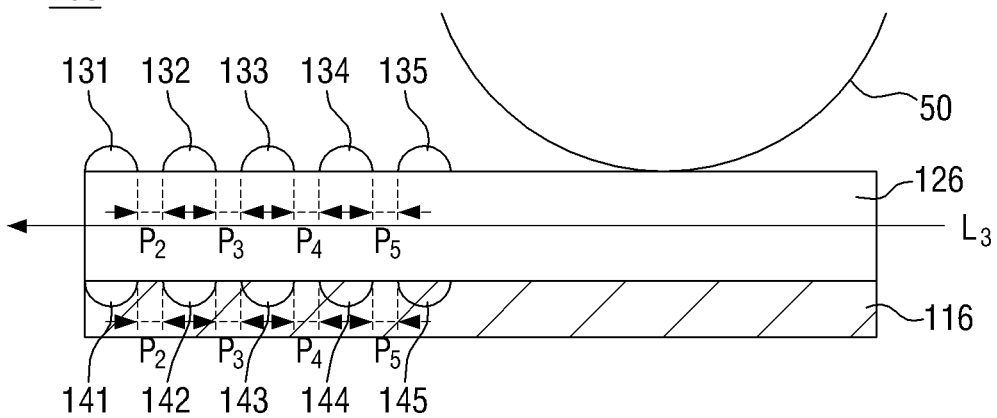

FIG. 11 is a cross-sectional view illustrating a light guide film of a display device according to another embodiment. Referring to FIG. 11, a light guide film 106 is different from the light guide film 103 of FIG. 8 in that a plurality of embossed patterns 131 through 135 and a plurality of embossed patterns 141 through 145 are formed on a flat top surface and a flat bottom surface, respectively, of a light guide layer 126. An adhesive layer 116 may be formed by the same method used to form the adhesive layer 111 of FIG. 6.

Figure 12:
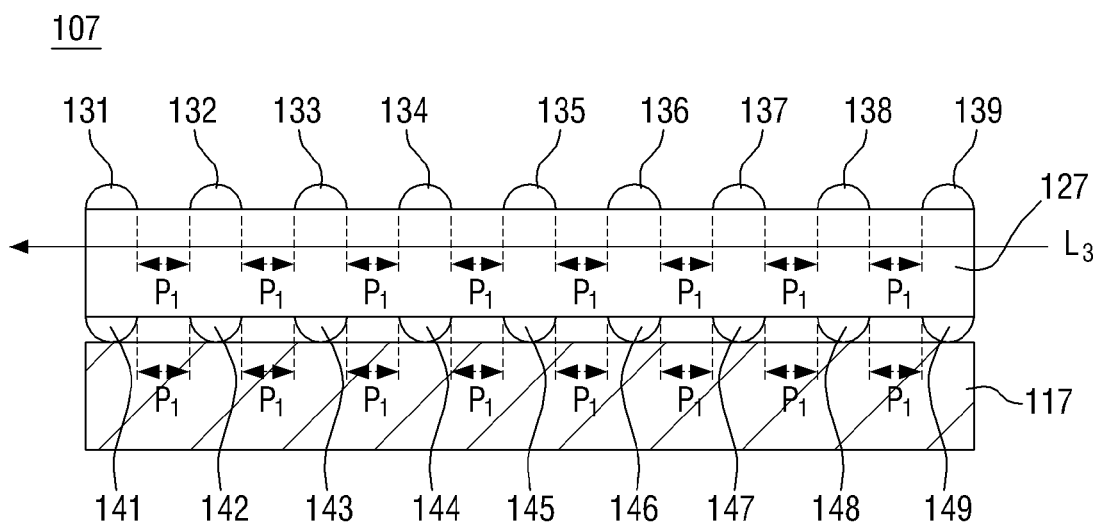

FIG. 12 is a cross-sectional view illustrating a light guide film of a display device according to another embodiment. Referring to FIG. 12, a light guide film 107 is different from the light guide film 104 of FIG. 9 in that an adhesive double-sided tape 117 may be attached onto the bottom of a light guide layer 127. A layer of air may be formed between the adhesive double-sided tape 117 and a plurality of embossed patterns 141 through 149, which are formed on the bottom surface of a light guide layer 127, and as a result, the total reflection of the UV light $L_3$ may be effectively carried out within the light guide layer 127.

Figure 13:
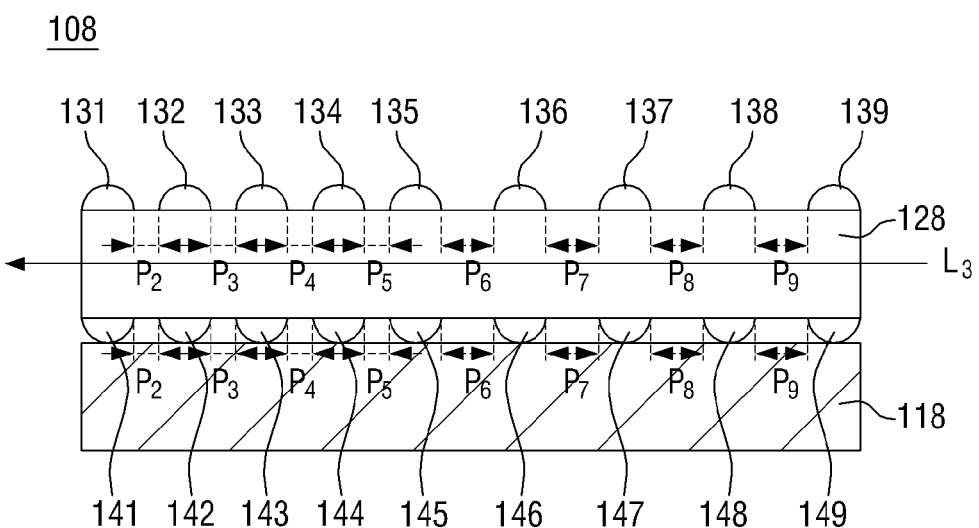

FIG. 13 is a cross-sectional view illustrating a light guide film of a display device according to another embodiment. Referring to FIG. 13, a light guide film 108 is different from the light guide film 105 of FIG. 10 in that an adhesive double-sided tape 118 is attached onto the bottom of a light guide layer 128.

Figure 14:
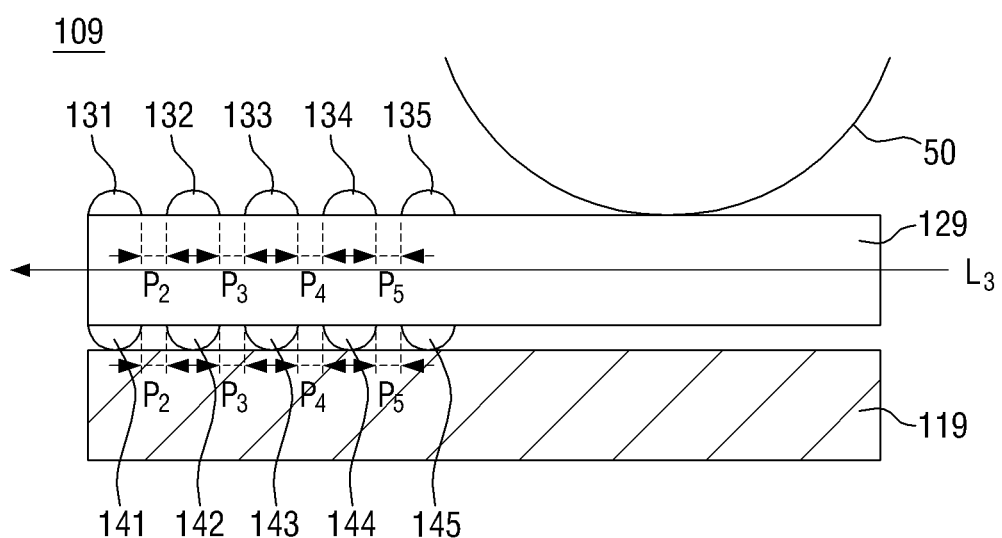

FIG. 14 is a cross-sectional view illustrating a light guide film of a display device according to another embodiment. Referring to FIG. 14, a light guide film 109 is different from the light guide film 106 of FIG. 11 in that an adhesive double-sided tape 119 is attached onto the bottom of a light guide layer 129.

Figure 15:
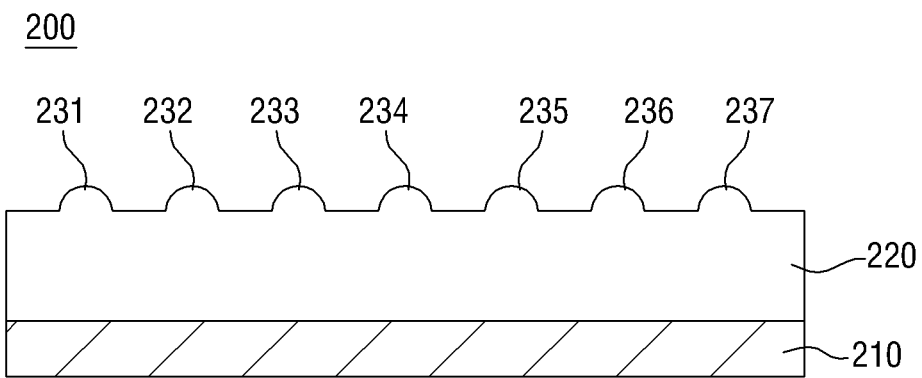

FIG. 15 is a cross-sectional view illustrating a light guide film of a display device according to another embodiment. Referring to FIG. 15, a light guide film 200 is different from the light guide film 101 of FIG. 6 in that a top surface of a light guide layer 220 is not flat but uneven with a plurality of embossed patterns 231 through 237. An adhesive layer 210 may be formed by the same method used to form the adhesive layer 111 of FIG. 6.

Figure 16:
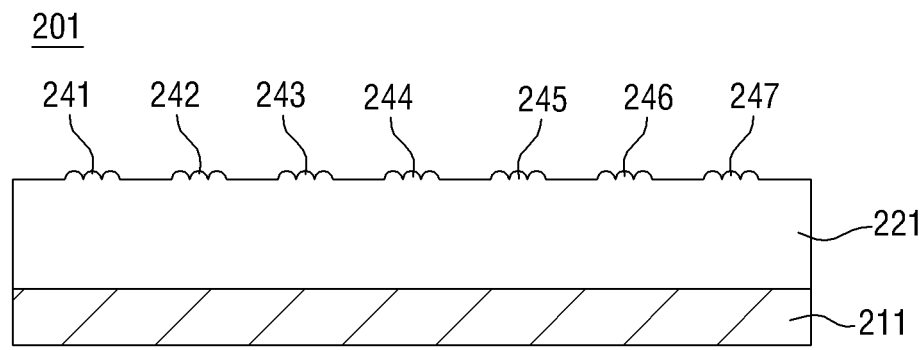

FIG. 16 is a cross-sectional view illustrating a light guide film of a display device according to another embodiment. Referring to FIG. 16, a light guide film 201 is different from the light guide film 200 of FIG. 15 in that a plurality of series of fine protrusions are formed as a plurality of embossed patterns 241 through 247. An adhesive layer 211, like the adhesive layer 210 of FIG. 15, may be formed by the same method used to form the adhesive layer 111 of FIG. 6.

Figure 17:
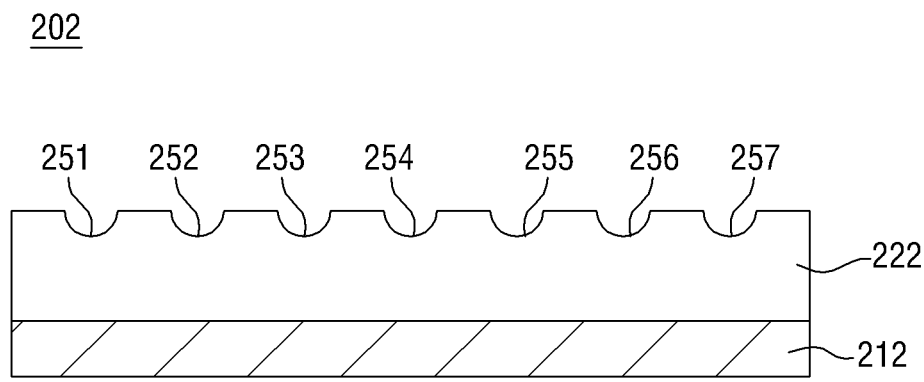

FIG. 17 is a cross-sectional view illustrating a light guide film of a display device according to another embodiment. Referring to FIG. 17, a light guide film 202 is different from the light guide film 200 of FIG. 15 in that a plurality of engraved patterns 251 through 257 are formed on a light guide layer 222. An adhesive layer 212 may be formed by the same method used to form the adhesive layer 111 of FIG. 6.

Figure 18:
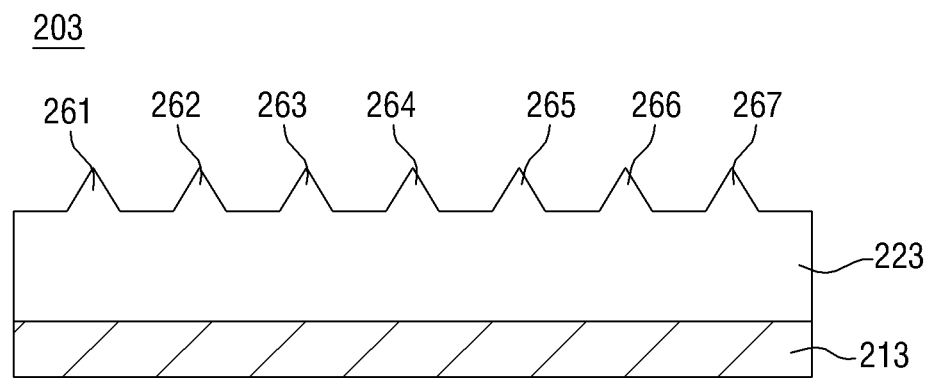

FIG. 18 is a cross-sectional view illustrating a light guide film of a display device according to another embodiment. Referring to FIG. 18, a light guide film 203 is different from the light guide film 200 of FIG. 15 in that a plurality of embossed patterns 261 through 267 are formed on a flat top surface of a light guide layer 223 in a triangular shape. An adhesive layer 213 may be formed by the same method used to form the adhesive layer 111 of FIG. 6. The shape of the embossed patterns 261 through 267 is not limited to a triangular shape. That is, the embossed patterns 261 through 267 may be formed in various polygonal shapes other than a triangular shape.

Figure 19:
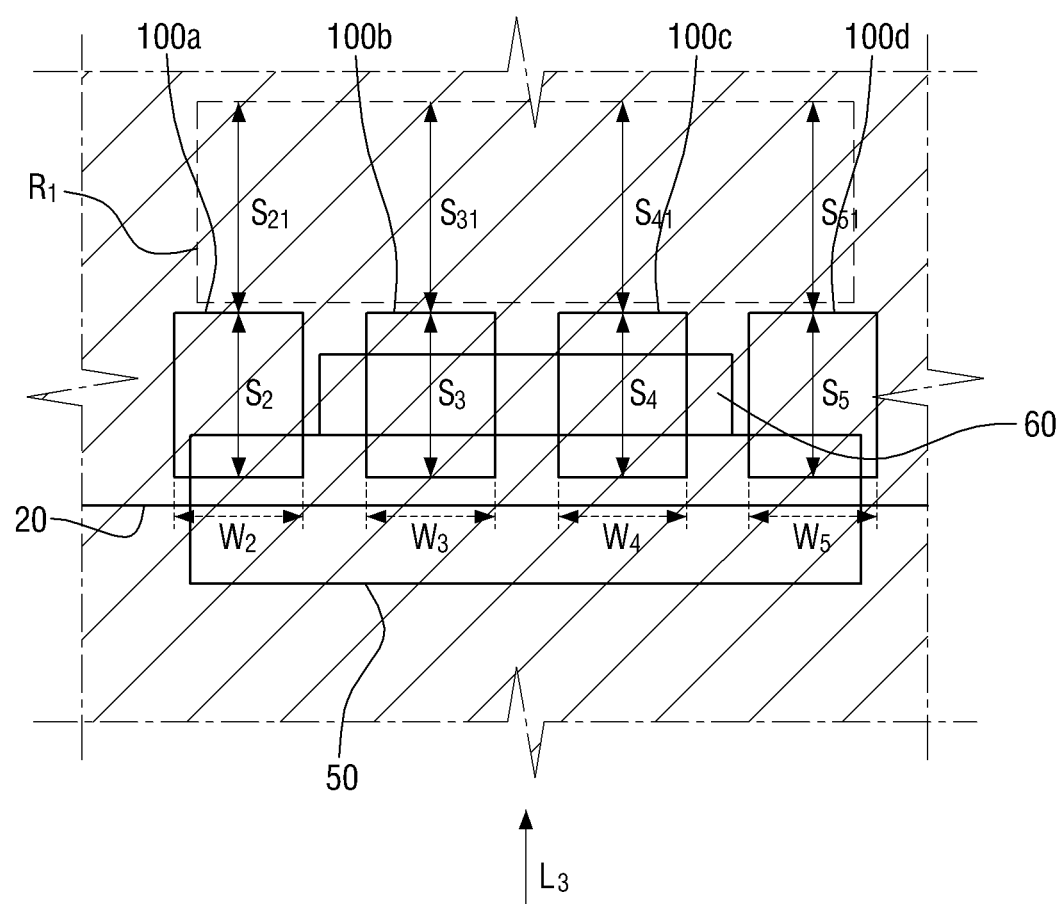
FIG. 19 is a plan view illustrating a display device according to another embodiment.

FIG. 19 is a plan view illustrating a display device according to another embodiment. Referring to FIG. 19, a display device according to another embodiment is different from the display device of FIG. 5 in that it includes a plurality of light guide films 100a, 100b, 100c and 100d, which are spaced by a predetermined distance. The light guide films 100a, 100b, 100c and 100d may have widths $W_2$, $W_3$, $W_4$ and $W_5$, respectively, and lengths $S_2$, $S_3$, $S_4$ and $S_5$, respectively. In the embodiment of FIG. 19, the UV light $L_3$ may be incident through the spaces between the light guide films 100a, 100b, 100c and 100d.

Figure 20:
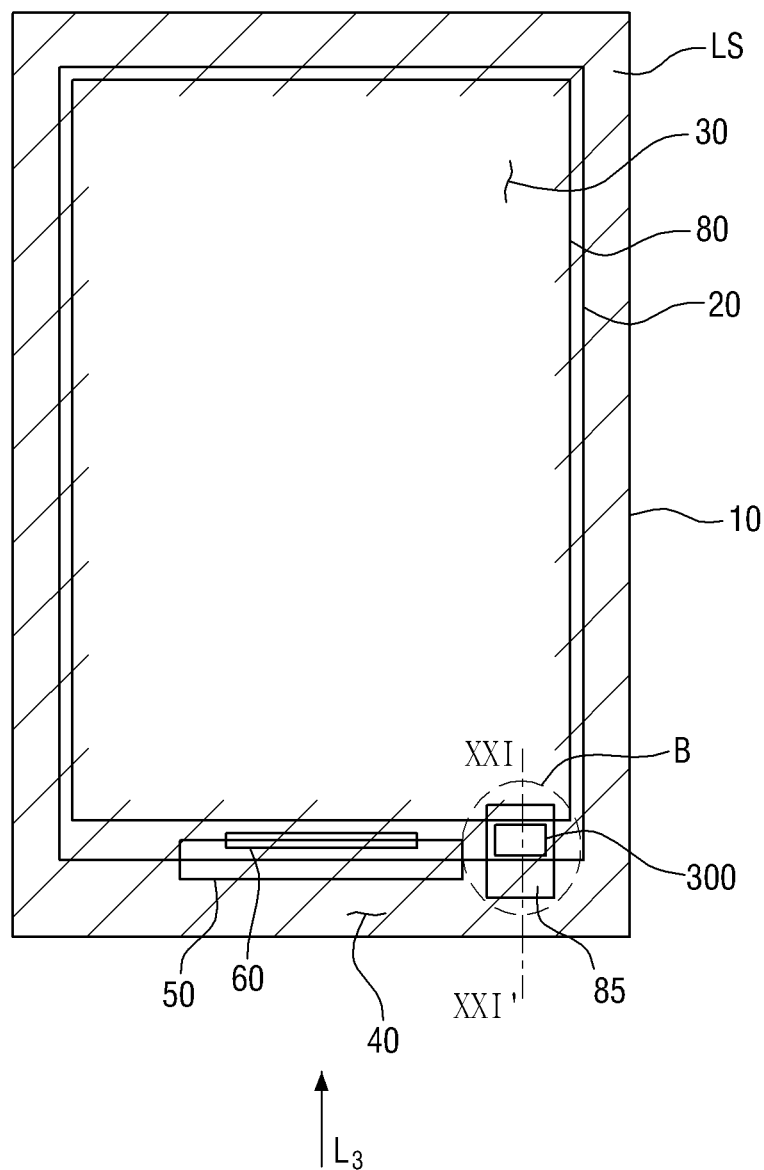
FIG. 20 is a layout diagram illustrating a display device according to another embodiment.
Figure 21:
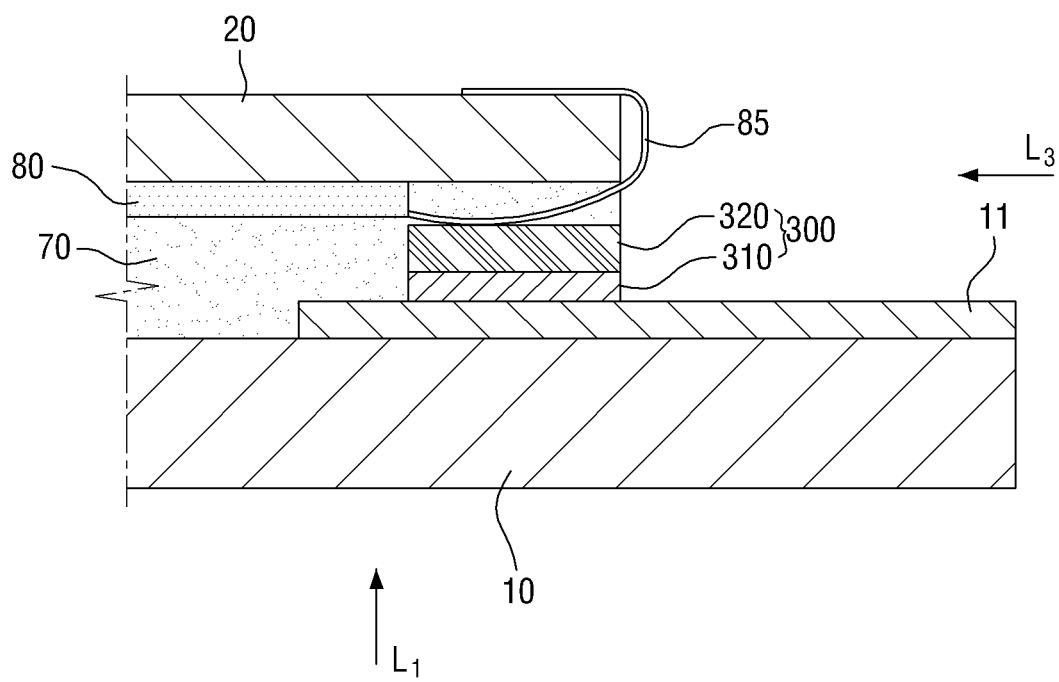
FIG. 21 is a cross-sectional view taken along line XXI-XXI' of FIG. 20.

FIG. 20 is a layout diagram illustrating a display device according to another embodiment, and FIG. 21 is a cross-sectional view taken along line XXI-XXI' of FIG. 20. Referring to FIGS. 20 and 21, a display device according to another embodiment may include a transparent protector 10, a bezel print pattern 11, a display panel 20, a UV curing layer 70, a touch screen panel 80, a PCB 85 and a light guide film 300. The light guide film 300 may include an adhesive layer 310 and a light guide layer 320. The display device of the embodiment of FIG. 20 is different from the display device of FIG. 1 or 2 in that it further includes the touch screen panel 80, which is disposed between the display panel 20, and that one end of the PCB 85 is connected to one surface of the touch screen panel 80 and the other end of the PCB 85 is connected to the other surface of the touch screen panel 80. The touch screen panel 80 may be disposed below the display panel 20 to be substantially overlapped by the display region 30.

Figure 22:
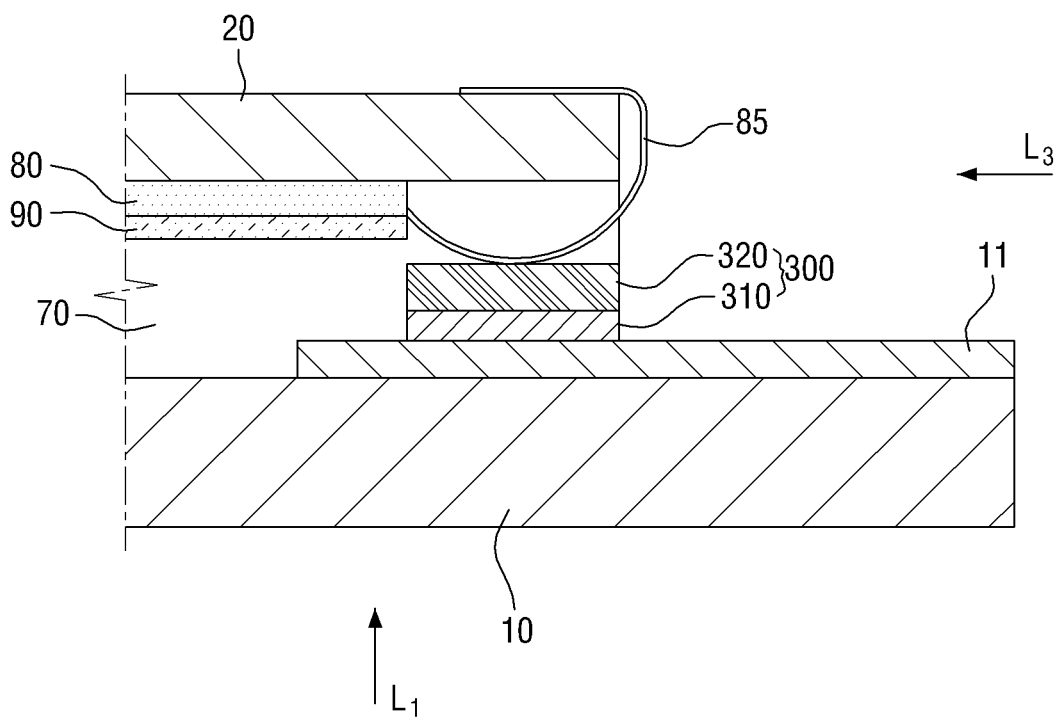
FIG. 22 is a cross-sectional view illustrating a display device according to another embodiment.

FIG. 22 is a cross-sectional view illustrating a display device according to another embodiment. Referring to FIG. 22, a display device according to another embodiment may include a transparent protector 10, a bezel print pattern 11, a display panel 20, a UV curing layer 70, a touch screen panel 80, a polarizing plate 90, a PCB 85 and a light guide film 300. The display device of FIG. 22 is different from the display device of FIG. 21 in that it further includes the polarizing plate 90, which is disposed between the touch screen panel 80 and the transparent protector 10.

A method of fabricating a display device, according to an embodiment is hereinafter described.

In a non-limiting example, the method may include: applying a UV curing agent between a transparent protector 10, which includes a light shield region LS and on which a bezel print pattern 11 and a light guide film 100 are formed, and a display panel 20, to which a UV-proof PCB 50 is connected, the light guide film 100 being attached on the bezel print pattern 11; and curing the UV curing agent by applying UV light while adjusting the amount or intensity of the UV light such that UV light $L_3$ incident upon the light guide film 100 may be relatively more intense than UV light $L_1$, $L_2$, $L_4$ or $L_5$ incident upon other parts of the display device.

In this example, the curing of the UV curing agent may include controlling the duration of application of the UV light $L_3$ or the intensity of the UV light $L_3$. For example, the UV light $L_3$ may be applied for a relatively long period of time, or the intensity of the UV light $L_3$ may be increased.

In another non-limiting example, the method may include: preparing a transparent protector 10, which includes a light shield region LS and on which a bezel print pattern 11 and a light guide film 100 are formed, a touch screen panel 80, to which a UV-proof PCB 85 is connected, and a display panel 20, the light guide film 100 being attached on the bezel print pattern 11; disposing the touch screen panel 80 between the transparent protector 10 and the display panel 20; applying a UV curing agent between the transparent protector 10 and the display panel 20; and curing the UV curing agent by applying UV light while adjusting the amount or intensity of the UV light such that UV light $L_3$ incident upon the light guide film 100 may be relatively more intense than UV light $L_1$, $L_2$, $L_4$ or $L_5$ incident upon other parts of the display device.

In another non-limiting example, a display device may be fabricated by: preparing a transparent protector 10, which includes a light shield region LS and on which a bezel print pattern 11 and a light guide film 100 are formed, a touch screen panel 80, to which a UV-proof PCB 85 is connected, a polarizing plate 90, and a display panel 20; disposing the touch screen panel 80 between the transparent protector 10 and the display panel 20, applying a UV curing agent between the transparent protector 10 and the display panel 20 and curing the UV curing agent by applying UV light while adjusting the amount or intensity of the UV light such that UV light $L_3$ incident upon the light guide film 100 may be relatively more intense than UV light $L_1$, $L_2$, $L_4$ or $L_5$ incident upon other parts of the display device.

Embodiments of the present invention provide at least one of the following advantages.

According to embodiments, it is possible to completely cure a UV-curing agent in a light shield region and thus to improve any exterior defects that may result from the reaction between any uncured UV curing agent and bezel ink.

However, the effects of the present invention are not restricted to the ones set forth herein. Other effects will be apparent from the following detailed description, the drawings, and the claims.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device, comprising:
   a display panel including a display region and a peripheral region;
   a transparent protector disposed to cover the display panel;
   a bezel print pattern disposed between the display panel and the transparent protector and configured to form a light shield region corresponding to the peripheral region;
   at least one light guide film disposed between the display panel and the bezel ink pattern in the light shield region;
   an ultraviolet (UV)-proof printed circuit board (PCB) disposed between the display panel and the light guide film and in contact with the light guide film; and
   a UV curing layer formed between the display panel and the transparent protector.

2. The display device of claim 1, wherein the light guide film comprises a light guide layer and an-adhesive layer formed below the light guide layer and coupled to the transparent protector.

3. The display device of claim 2, wherein the light guide layer comprises a plurality of embossed patterns.

4. The display device of claim 3, wherein the embossed patterns are formed on a flat top surface and/or a flat bottom surface of the light guide layer.

5. The display device of claim 4, wherein the embossed patterns are formed on at least one of a part of the flat top surface or a part of the flat bottom surface of the light guide layer on one side of a point or surface of contact between the UV-proof PCB and the light guide film.

6. The display device of claim 3, wherein the embossed patterns are formed to have a uniform pitch therebetween.

7. The display device of claim 3, wherein the embossed patterns are formed to have different pitches therebetween.

8. The display device of claim 7, wherein a pitch between a pair of adjacent embossed patterns in an area near a light incidence plane of the light guide layer is greater than a pitch between a pair of adjacent embossed patterns in an area near a light exit plane of the light guide layer.

9. The display device of claim 7, wherein a pitch between a pair of adjacent embossed patterns gradually decreases from a light incidence plane of the light guide layer to a light exit plane of the light guide layer.

10. The display device of claim 2, wherein the adhesive layer comprises a coating layer of an adhesive.

11. The display device of claim 2, wherein the adhesive layer comprises an adhesive double-sided tape.

12. The display device of claim 1, wherein the display device comprises two or more light guide films configured to be spaced from each other.

13. The display device of claim 1, wherein the UV-proof PCB comprises a flexible PCB.

14. The display device of claim 1, wherein the UV-proof PCB is configured to be connected to a driving circuit of the display panel.

15. The display device of claim 1, further comprising:
a touch screen panel disposed between the display region of the display panel and the transparent protector.

16. The display device of claim 15, wherein the UV-proof PCB is configured to be connected to the touch screen panel.

17. The display device of claim 16, further comprising:
a polarizing plate disposed between the touch screen panel and the transparent protector.

18. A method of fabricating a display device, comprising:
applying a UV curing agent between a transparent protector, on which a bezel print pattern and a light guide film are formed, and a display panel, to which a UV-proof PCB is connected, the light guide film being attached on the bezel print pattern; and
curing the UV curing agent by applying UV light while adjusting the amount or intensity of the UV light such that UV light incident upon the light guide film is more intense than UV light incident upon other parts of the display device.

* * * * *